(12) United States Patent
Ahn et al.

(10) Patent No.: US 10,518,383 B2
(45) Date of Patent: Dec. 31, 2019

(54) POROUS POLYURETHANE POLISHING PAD AND PROCESS FOR PREPARING A SEMICONDUCTOR DEVICE BY USING THE SAME

(71) Applicant: SKC CO., LTD., Suwon-si, Gyeonggi-do (KR)

(72) Inventors: Jaein Ahn, Seongnam-si (KR); Jang Won Seo, Busan (KR); Sunghoon Yun, Seongnam-si (KR); Su Young Moon, Anyang-si (KR); Myung-Ok Kyun, Suwon-si (KR)

(73) Assignee: SKC CO., LTD., Suwon-si (KR)

( * ) Notice: Subject to any disclaimer, the term of this patent is extended or adjusted under 35 U.S.C. 154(b) by 0 days.

(21) Appl. No.: 15/989,403

(22) Filed: May 25, 2018

(65) Prior Publication Data

US 2018/0339394 A1    Nov. 29, 2018

(30) Foreign Application Priority Data

May 29, 2017   (KR) .......................... 10-2017-0066076

(51) Int. Cl.
*B24B 37/24* (2012.01)
*C08G 18/10* (2006.01)
(Continued)

(52) U.S. Cl.
CPC ............... *B24B 37/24* (2013.01); *B24B 37/20* (2013.01); *B24D 3/32* (2013.01); *C08G 18/10* (2013.01);
(Continued)

(58) Field of Classification Search
None
See application file for complete search history.

(56) References Cited

U.S. PATENT DOCUMENTS

| 5,252,617 A | 10/1993 | Werner et al. |
| 2004/0021243 A1* | 2/2004 | Shih ........................ B24B 37/24 264/51 |

(Continued)

FOREIGN PATENT DOCUMENTS

| JP | 2001-232555 A | 8/2001 |
| JP | 2006-320980 A | 11/2006 |

(Continued)

OTHER PUBLICATIONS

Office Action from Korean Patent Application No. 10-2017-0066076 dated Jun. 28, 2017.

*Primary Examiner* — Jiong-Ping Lu
(74) *Attorney, Agent, or Firm* — Sughrue Mion, PLLC

(57) ABSTRACT

The embodiments relate to a porous polyurethane polishing pad and a process for preparing a semiconductor device by using the same. The porous polyurethane polishing pad comprises a urethane-based prepolymer and a curing agent, and has a thickness of 1.5 to 2.5 mm, a number of pores whose average diameter is 10 to 60 μm, a specific gravity of 0.7 to 0.9 g/cm$^3$, a surface hardness at 25° C. of 45 to 65 Shore D, a tensile strength of 15 to 25 N/mm$^2$, an elongation of 80 to 250%, an AFM (atomic force microscope) elastic modulus of 101 to 250 MPa measured from a polishing surface in direct contact with an object to be polished to a predetermined depth wherein the predetermined depth is 1 to 10 μm.

10 Claims, 2 Drawing Sheets

(51) Int. Cl.
  *C08J 9/32* (2006.01)
  *B24D 3/32* (2006.01)
  *H01L 21/306* (2006.01)
  *B24B 37/20* (2012.01)
  *H01L 21/321* (2006.01)
  *H01L 23/532* (2006.01)

(52) U.S. Cl.
  CPC .......... *C08J 9/32* (2013.01); *H01L 21/30625* (2013.01); *C08J 2203/22* (2013.01); *C08J 2205/044* (2013.01); *C08J 2205/05* (2013.01); *C08J 2207/00* (2013.01); *C08J 2375/04* (2013.01); *H01L 21/3212* (2013.01); *H01L 23/53257* (2013.01)

(56) References Cited

U.S. PATENT DOCUMENTS

| | | |
|---|---|---|
| 2009/0093201 A1 | 4/2009 | Kazuno et al. |
| 2009/0137120 A1 | 5/2009 | Huang et al. |
| 2009/0258493 A1 | 10/2009 | Matsui et al. |
| 2011/0159786 A1 | 6/2011 | Joseph |
| 2014/0370788 A1 | 12/2014 | Nair |
| 2015/0375361 A1 | 12/2015 | Qian et al. |
| 2016/0339559 A1* | 11/2016 | Kim ........................ B24B 37/24 |

FOREIGN PATENT DOCUMENTS

| | | |
|---|---|---|
| JP | 2010-74119 A | 4/2010 |
| JP | 2011-73112 A | 4/2011 |
| JP | 2011-199175 A | 10/2011 |
| JP | 2016-126954 A | 7/2016 |
| KR | 10-2011-0019442 A | 2/2011 |
| KR | 10-2016-0000855 A | 1/2016 |
| KR | 10-1608901 B1 | 4/2016 |
| TW | 200639019 A | 11/2006 |
| TW | 200709891 A | 3/2007 |
| TW | 200940613 A | 10/2009 |
| TW | 201501865 A | 1/2015 |

\* cited by examiner

[Fig. 1]
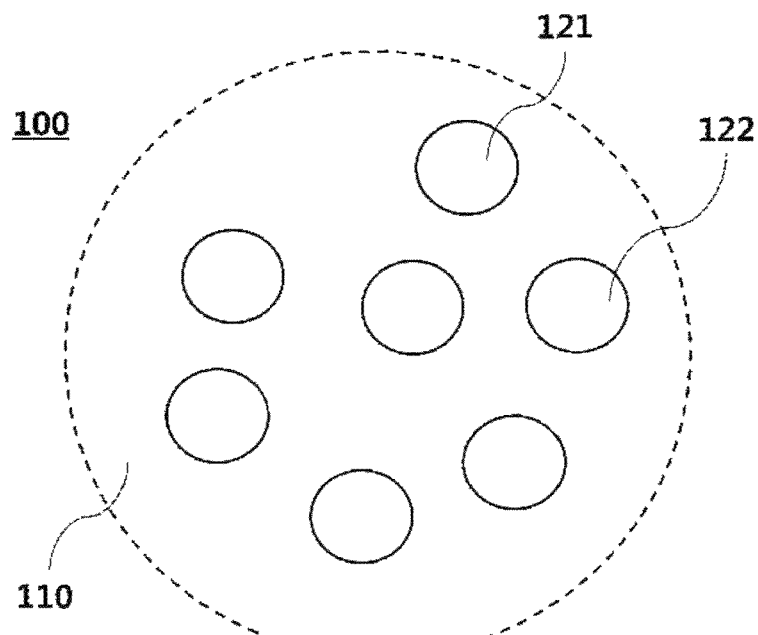
[Fig. 2]
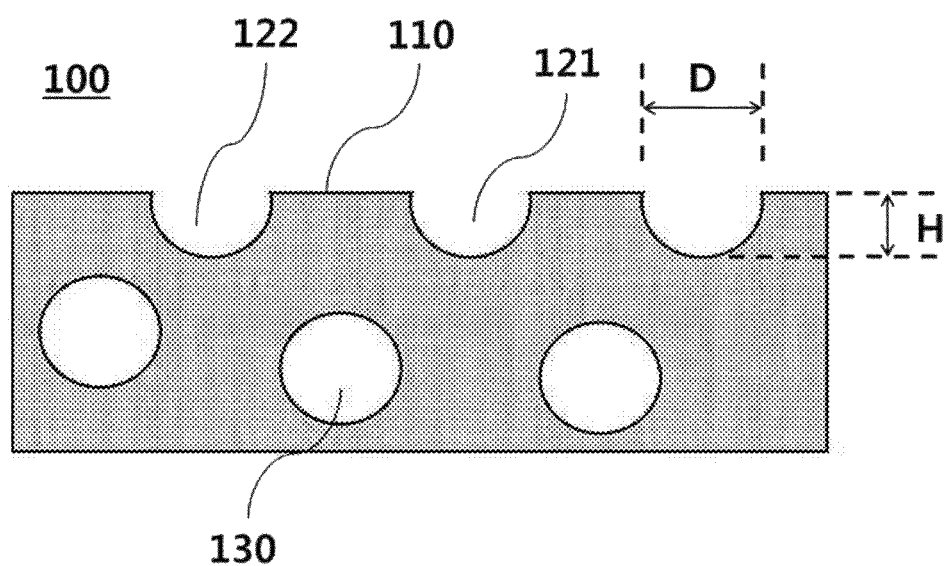

[Fig. 3]
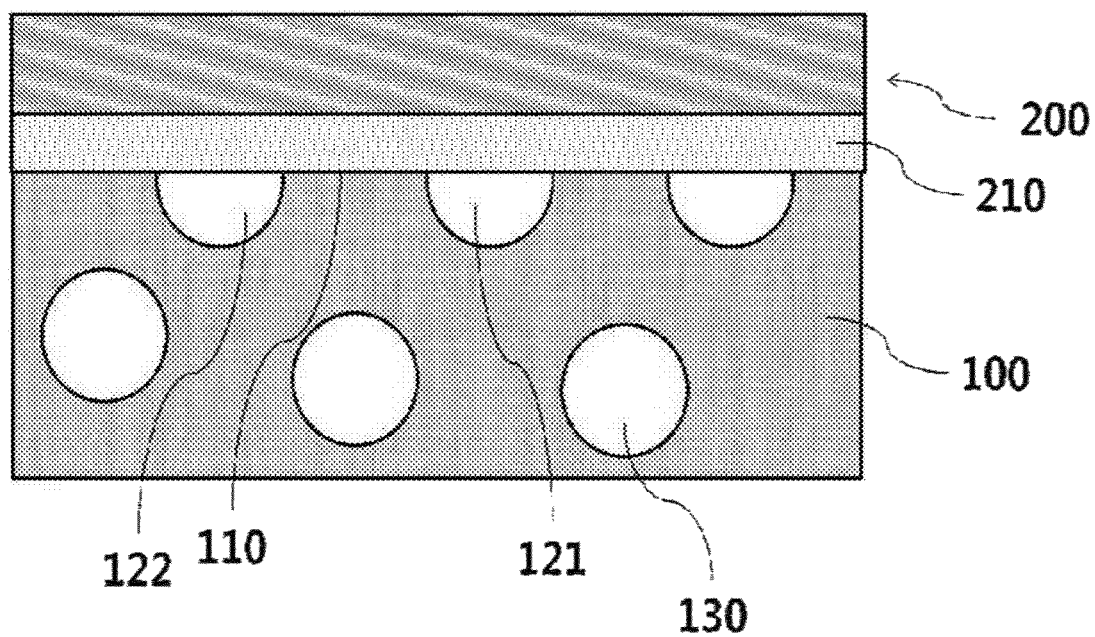

POROUS POLYURETHANE POLISHING PAD AND PROCESS FOR PREPARING A SEMICONDUCTOR DEVICE BY USING THE SAME

TECHNICAL FIELD

Embodiments relate to a porous polyurethane polishing pad for use in a chemical mechanical planarization (CMP) process of semiconductors and a process for preparing to a semiconductor device by using the same.

BACKGROUND ART

The chemical mechanical planarization (CMP) process in a process for preparing semiconductors refers to a step in which a wafer is fixed to a head and in contact with the surface of a polishing pad mounted on a platen, and the wafer is then chemically treated by supplying a slurry while the platen and the head are relatively moved to thereby mechanically planarize the irregularities on the wafer surface.

A polishing pad is an essential member that plays an important role in such a CMP process. In general, a polishing pad is composed of a polyurethane-based resin and has grooves on its surface for a large flow of a slurry and pores for supporting a fine flow thereof.

The pores in a polishing pad may be formed by using a solid phase foaming agent having voids, a liquid phase foaming agent filled with a volatile liquid, an inert gas, a fiber, or the like, or by generating a gas by a chemical reaction.

The technique of forming pores using an inert gas or a volatile liquid phase foaming agent has the advantage that any material that may affect the CMP process is not discharged. However, it is difficult to precisely control the diameter of pores and the density of the pad since it is inevitable to deal with a gas phase, which is not conveniently controlled. It is particularly difficult to produce uniform pores of 50 μm or less. In addition, there is a problem that it is very difficult to control the diameter of pores and the density of the pad without changing the composition of the polyurethane matrix of the polishing pad.

As the solid phase foaming agent, microcapsules (i.e., thermally expanded microcapsules), whose size has been adjusted by a thermal expansion, are used. Since the thermally expanded microcapsules in a structure of already expanded micro-balloons have a uniform particle diameter, the diameter of pores can be uniformly controlled. For example, Korean Patent No. 1608901 discloses a polishing pad, which is to formed using a solid phase foaming agent and comprises pores having a uniform diameter.

DISCLOSURE OF THE INVENTION

Technical Problem

Accordingly, the embodiments aim to provide a porous polyurethane polishing pad having improved polishing efficiency and a process for preparing a semiconductor device by using the same.

Solution to the Problem

According to an embodiment, there is provided a porous polyurethane polishing pad, which comprises a urethane-based prepolymer and a curing agent, and which has a thickness of 1.5 to 2.5 mm, a number of pores whose average diameter is 10 to 60 μm, a specific gravity of 0.7 to 0.9 g/cm$^3$, a surface hardness at 25° C. of 45 to 65 Shore D, a tensile strength of 15 to 25 N/mm$^2$, an elongation of 80 to 250%, an AFM (atomic force microscope) elastic modulus of 101 to 250 MPa measured from a polishing surface in direct contact with an object to be polished to a predetermined depth wherein the predetermined depth is 1 to 10 μm.

According to another embodiment, there is provided a process for preparing a semiconductor device, which comprises providing a porous polyurethane polishing pad; disposing an object to be polished on the polishing pad; and relatively rotating the object to be polished with respect to the polishing pad to polish the object, wherein the polishing pad comprises a urethane-based prepolymer and a curing agent, and the polishing pad has a thickness of 1.5 to 2.5 mm, a number of pores whose average diameter is 10 to 60 μm, a specific gravity of 0.7 to 0.9 g/cm$^3$, a surface hardness at 25° C. of 45 to 65 Shore D, a tensile strength of 15 to 25 N/mm$^2$, an elongation of 80 to 250%, an AFM elastic modulus of 101 to 250 MPa measured from a polishing surface in direct contact with the object to be polished to a predetermined depth wherein the predetermined depth is 1 to 10 μm.

Advantageous Effects of the Invention

The porous polyurethane polishing pad according to the embodiments is capable of controlling the polishing performance (i.e., polishing rate) of the polishing pad by adjusting the thickness, specific gravity, surface hardness, tensile strength, elongation, AFM (atomic force microscope) elastic modulus, and pore size of the polishing pad. In particular, since the AFM elastic modulus and the like of a polishing surface, i.e., an area in direct contact with the object to be polished, is appropriately adjusted, a wafer or the like can be efficiently polished. Especially, the porous polyurethane polishing pad can effectively polish a layer containing a metal such as tungsten or the like. Further, the polishing pad can prevent scratches or the like that may be generated on a wafer or the like.

BRIEF DESCRIPTION OF THE DRAWINGS

FIG. 1 is a schematic view showing the top surface of a polishing pad according to an embodiment.

FIG. 2 is a schematic view showing the cross-section of a polishing pad according to an embodiment.

FIG. 3 is a schematic view showing a process of polishing an object to be polished using a polishing pad according to an embodiment.

DETAILED DESCRIPTION FOR CARRYING OUT THE INVENTION

Throughout the description of the embodiments, in the case where each pad, layer, pore, or membrane is mentioned to be formed "on" or "under" another pad, layer, pore, or membrane, it means not only that one element is directly formed on or under another element, but also that one element is indirectly formed on or under another element with other element(s) interposed between them. Also, the term "on" or "under" with respect to each element may be referenced to the drawings. For the sake of description, the sizes of individual elements in the appended drawings may be exaggeratingly depicted and do not indicate the actual sizes.

Hereinafter, the present invention will be described in detail with reference to embodiments. The embodiments can be modified into various forms as long as the gist of the invention is not changed.

The porous polyurethane polishing pad according to an embodiment comprises a urethane-based prepolymer and a curing agent. Further, as shown in FIGS. 1 to 3, the polishing pad according to the embodiment comprises a number of pores.

The porous polyurethane polishing pad according to an embodiment may be prepared by a process for preparing a porous polyurethane polishing pad, which comprises (1) injecting a mixture comprising a urethane-based prepolymer, a curing agent, and a solid phase foaming agent into a mold and molding the mixture; and (2) curing the mixture.

Prepolymer

A prepolymer generally refers to a polymer having a relatively low molecular weight wherein the degree of polymerization is adjusted to an intermediate level so as to conveniently mold a molded article finally produced in the process of preparing the same. A prepolymer may be molded by itself or after a reaction with another polymerizable compound. For example, a prepolymer may be prepared by reacting an isocyanate compound with a polyol.

For example, the isocyanate compound that may be used in the preparation of the urethane-based prepolymer may be at least one isocyanate selected from the group consisting of toluene diisocyanate (TDI), naphthalene-1,5-diisocyanate, p-phenylene diisocyanate, tolidine diisocyanate, 4,4'-diphenylmethane diisocyanate, hexamethylene diisocyanate, dicyclohexylmethane diisocyanate, and isophorone diisocyanate.

For example, the polyol that may be used in the preparation of the urethane-based to prepolymer may be at least one polyol selected from the group consisting of a polyether polyol, a polyester polyol, a polycarbonate polyol, and an acryl polyol. The polyol may have a weight average molecular weight (Mw) of 300 to 3,000 g/mole.

The urethane-based prepolymer may have a weight average molecular weight of 500 to 3,000 g/mole. Specifically, the urethane-based prepolymer may have a weight average molecular weight (Mw) of 600 to 3,000 g/mole, 600 to 2,500 g/mole, 600 to 2,000 g/mole, 700 to 1,500 g/mole, or 800 to 1,500 g/mole.

As an example, the urethane-based prepolymer may be a polymer polymerized from toluene diisocyanate as the isocyanate compound and polytetramethylene ether glycol as the polyol and having a weight average molecular weight (Mw) of 500 to 3,000 g/mole.

Curing Agent

The curing agent may be at least one of an amine compound and an alcohol compound. Specifically, the curing agent may comprise at least one compound selected from the group consisting of an aromatic amine, an aliphatic amine, an aromatic alcohol, and an aliphatic alcohol.

For example, the curing agent may comprise at least one selected from the group consisting of 4,4'-methylenebis(2-chloroaniline) (MOCA), diethyltoluenediamine, diaminodiphenyl methane, diaminodiphenyl sulphone, m-xylylene diamine, isophoronediamine, ethylenediamine, diethylenetriamine, triethylenetetramine, polypropylenediamine, polypropylenetriamine, ethylene glycol, diethylene glycol, dipropylene glycol, butanediol, hexanediol, glycerin, trimethylolpropane, and bis(4-amino-3-chlorophenyl)methane.

Solid Phase Foaming Agent

The solid phase foaming agent is thermally expanded microcapsules and may have a structure of micro-balloons having an average particle diameter of 5 to 200 μm. Specifically, the solid phase foaming agent may have an average particle diameter of 10 to 150 μm, 10 to 100 μm, or 10 to 60 μm. More specifically, the solid phase foaming agent may have an average particle diameter of 20 to 60 μm, 20 to 50 μm, 10 to 50 μm, or 25 to 45 μm. In addition, the thermally expanded microcapsules may be obtained by thermally expanding thermally expandable microcapsules.

The thermally expandable microcapsule may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic-based copolymer. Furthermore, the foaming agent encapsulated in the inside may comprise at least one selected from the group consisting of hydrocarbons having 1 to 7 carbon atoms and the hydrocarbons substituted with a halogen or a heteroatom. Specifically, the foaming agent encapsulated in the inside may comprise at least one selected from the group consisting of a low molecular weight hydrocarbon such as ethane, ethylene, propane, propene, n-butane, isobutane, butene, isobutene, n-pentane, isopentane, neopentane, n-hexane, heptane, petroleum ether, and the like; a chlorofluorohydrocarbon such as trichlorofluoromethane ($CCl_3F$), dichlorodifluoromethane ($CCl_2F_2$), chlorotrifluoromethane ($CClF_3$), tetrafluoroethylene ($CClF_2$—$CCF_2$), and the like; and a tetraalkylsilane such as tetramethylsilane, trimethylethylsilane, trimethylisopropylsilane, trimethyl-n-propylsilane, and the like.

The solid phase foaming agent may be employed in an amount of 0.5 to 10 parts by weight, 0.5 to 5 parts by weight, 0.5 to 3 parts by weight, 0.5 to 2.5 parts by weight, 1 to 5 parts by weight, 1 to 3 parts by weight, 1.3 to 2.7 parts by weight, or 1.5 to 2.5 parts by weight, based on 100 parts by weight of the urethane-based prepolymer.

Feeding of Raw Materials

In the step (1), an inert gas may be fed into the mold when the mixture is injected to into the mold. The inert gas may be added while the urethane-based prepolymer, the curing agent, and the solid phase foaming agent are mixed and reacted, to thereby form pores in the polishing pad.

The kind of the inert gas is not particularly limited as long as it is a gas that does not participate in the reaction between the prepolymer and the curing agent. For example, the inert gas may comprise at least one selected from the group consisting of nitrogen gas ($N_2$), argon gas (Ar), and helium (He). Specifically, the inert gas may comprise nitrogen gas ($N_2$) or argon gas (Ar). More specifically, the inert gas may be nitrogen gas ($N_2$) or argon gas (Ar).

The inert gas may be fed in a volume of 5 to 30% based on the total volume of the mixture. Specifically, the inert gas may be fed in a volume of 5 to 25%, 5 to 20%, 10 to 30%, 10 to 25%, or 10 to 20% based on the total volume of the mixture, with a target specific gravity of the polyurethane sheet of 0.7 to 0.9 g/cm³ or about 0.8 g/cm³.

Reaction Rate Controlling Agent

The mixture may further comprise a reaction rate controlling agent. The reaction rate controlling agent may be at least one selected from the group consisting of a tertiary amine-based compound and an organometallic-based compound. In addition, the reaction rate controlling agent may be a reaction promoter or a reaction retarder. Specifically, the reaction rate controlling agent may be a reaction promoter.

For example, the reaction rate controlling agent may comprise at least one selected from the group consisting of triethylene diamine (TEDA), dimethyl ethanol amine (DMEA), tetramethyl butane diamine (TMBDA), 2-methyltriethylene diamine, dimethyl cyclohexyl amine (DMCHA), triethyl amine (TEA), triisopropanol amine (TIPA), 1,4-diazabicyclo(2,2,2)octane, bis(2-methylaminoethyl) ether, trimethylaminoethylethanol amine, N,N,N,N,N"-pentamethyldiethylene triamine, dimethylaminoethyl amine, dimethylaminopropyl amine, benzyldimethyl amine, N-ethylmorpholine, N,N-dimethylaminoethylmorpholine, N,N-dimethylcyclohexyl amine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate controlling agent may comprise at least one selected from the group consisting of benzyldimethyl amine, N,N-dimethylcyclohexyl amine, and triethyl amine.

The reaction rate controlling agent may be employed in an amount of 0.1 to 2 parts by weight based on 100 parts by weight of the urethane-based prepolymer. Specifically, the reaction rate controlling agent may be employed in an amount of 0.2 to 1.8 parts by weight, 0.2 to 1.7 parts by weight, 0.2 to 1.6 parts by weight, 0.2 to 1.5 parts by weight, 0.3 to 1.5 parts by weight, 0.3 to 1 parts by weight, or 0.3 to 0.8 parts by weight, based on 100 parts by weight of the urethane-based prepolymer. If the reaction rate controlling agent is employed in an amount within the above range, the reaction rate (i.e., the time for solidification) of the mixture (i.e., the urethane-based prepolymer, the curing agent, the solid phase foaming agent, the reaction rate controlling agent, and a silicone surfactant) is properly controlled, so that a polishing pad having pores of a desired size can be produced.

Surfactant

The mixture may further comprise a surfactant. The surfactant may act to prevent the pores to be formed from overlapping and coalescing with each other. Specifically, the surfactant is preferably a silicone-based nonionic surfactant. But other surfactants may be variously selected depending on the physical properties required for the polishing pad.

As the silicone-based nonionic surfactant, a silicone-based nonionic surfactant having a hydroxyl group may be used alone or in combination with a silicone-based nonionic surfactant having no hydroxyl group.

The silicone-based nonionic surfactant having a hydroxyl group is not particularly limited as long as it is widely used in the polyurethane technology industry since it is to excellent in compatibility with an isocyanate-containing compound and an active hydrogen compound. Examples of the silicone-based nonionic surfactant having a hydroxyl group, which is commercially available, include DOW CORNING 193 (a silicone glycol copolymer in a liquid phase having a specific gravity at 25° C. of 1.07, a viscosity at 20° C. of 465 mm$^2$/s, and a flash point of 92° C.) (hereinafter referred to as DC-193) manufactured by Dow Corning, B8462 of Evonik Industries, and the like.

Examples of the silicone-based nonionic surfactant having no hydroxyl group, which is commercially available, include DOW CORNING 190 (a silicone glycol copolymer having a Gardner color number of 2, a specific gravity at 25° C. of 1.037, a viscosity at 25° C. of 2,000 mm$^2$/s, a flash point of 63° C. or higher, and an inverse solubility point (1.0% water solution) of 36° C. (hereinafter referred to as DC-190) manufactured by Dow Corning and the like.

The surfactant may be employed in an amount of 0.2 to 2 parts by weight based on 100 parts by weight of the urethane-based prepolymer. Specifically, the surfactant may be employed in an amount of 0.2 to 1.9 parts by weight, 0.2 to 1.8 parts by weight, 0.2 to 1.7 parts by weight, 0.2 to 1.6 parts by weight, 0.2 to 1.5 parts by weight, 0.2 to 1 parts by weight, 0.3 to 0.8 parts by weight, or 0.4 to 0.8 parts by weight, based on 100 parts by weight of the urethane-based prepolymer. If the amount of the surfactant is within the above range, pores derived from the gas phase foaming agent can be stably formed and maintained in the mold.

As an example, the urethane-based prepolymer, the curing agent, the solid phase foaming agent, the reaction rate controlling agent, the surfactant, and the inert gas may be put into the mixing step substantially at the same time.

As another example, the urethane-based prepolymer, the solid phase foaming agent, and the surfactant may be mixed in advance, followed by feeding of the curing agent, the reaction rate controlling agent, and the inert gas.

The mixing initiates the reaction of the urethane-based prepolymer and the curing to agent by mixing them and uniformly disperses the solid phase foaming agent and the inert gas in the raw materials. In such event, the reaction rate controlling agent may intervene in the reaction between the urethane-based prepolymer and the curing agent from the beginning of the reaction, to thereby control the reaction rate. Specifically, the mixing may be carried out at a speed of 1,000 to 10,000 rpm, 2,000 to 10,000 rpm, 2,000 to 7,000 rpm, 2,000 to 5,000 rpm, or 2,000 to 4,000 rpm. Within the above speed range, it may be more advantageous for the inert gas and the solid phase foaming agent to be uniformly dispersed in the raw materials.

The urethane-based prepolymer and the curing agent may be mixed at a molar equivalent ratio of 1:0.8 to 1.2, or a molar equivalent ratio of 1:0.9 to 1.1, based on the number of moles of the reactive groups in each molecule. Here, "the number of moles of the reactive groups in each molecule" refers to, for example, the number of moles of the isocyanate group in the urethane-based prepolymer and the number of moles of the reactive groups (e.g., amine group, alcohol group, and the like) in the curing agent. Therefore, the urethane-based prepolymer and the curing agent may be fed at a constant rate during the mixing step by controlling the feeding rates such that the urethane-based prepolymer and the curing agent are fed per unit time in amounts satisfying the molar equivalent ratio exemplified above.

Reaction and Formation of Pores

The urethane-based prepolymer and the curing agent react with each other upon the mixing to form a solid polyurethane, which is then formed into a sheet or the like. Specifically, the isocyanate terminal group in the urethane-based prepolymer can react with the amine group, the alcohol group, and the like in the curing agent. In such event, the inert gas and the solid phase foaming agent are uniformly dispersed in the raw materials to form pores without participating in the reaction between the urethane-based prepolymer and the curing agent.

In addition, the reaction rate controlling agent adjusts the diameter of the pores by promoting or retarding the reaction between the urethane-based prepolymer and the curing agent. For example, if the reaction rate controlling agent is a reaction retarder for delaying the reaction, the time for which the inert gas finely dispersed in the raw materials are combined with each other is prolonged, so that the average diameter of the pores can be increased. On the other hand, if the reaction rate controlling agent is a reaction promoter for expediting the reaction, the time for which the inert gas finely dispersed in the raw materials are combined with each other is shortened, so that the average diameter of the pores can be reduced.

Molding

The molding is carried out using a mold. Specifically, the raw materials (i.e., a mixture comprising the urethane-based prepolymer, the curing agent, and the solid phase foaming agent) sufficiently stirred in a mixing head or the like may be injected into a mold to fill the inside thereof.

The mixture is cured to produce a molded body in the form of a solidified cake. Specifically, the reaction between the urethane-based prepolymer and the curing agent is completed in the mold, so that a molded body in the form of a solidified cake that conforms to the shape of the mold can be obtained.

Thereafter, the molded body thus obtained may be appropriately sliced or cut into a sheet for the production of a polishing pad. As an example, a molded body is prepared in a mold having a height of 5 to 50 times the thickness of a polishing pad to be finally produced and is then sliced in the same thickness to produce a plurality of sheets for the polishing pads at a time. The height of the mold may be about 5 to about 50 times the thickness of the polishing pad finally produced to prepare sheets therefor. However, the sliced sheets may have pores of different diameters depending on the molded location inside the mold. That is, a sheet molded at the lower position of the mold has pores of a fine diameter, whereas a sheet molded at the upper position of the mold may have pores of a larger diameter than that of the sheet formed at the lower position.

Therefore, it is preferable to use a mold capable of producing one sheet by one molding in order for each sheet to have pores of a uniform diameter. To this end, the height of the mold may not significantly differ from the thickness of the porous polyurethane polishing pad to be finally produced. For example, the molding may be carried out using a mold having a height of 1 to 3 times the thickness of the porous polyurethane polishing pad to be finally produced. More specifically, the mold may have a height of 1.1 to 2.5 times, or 1.2 to 2 times, the thickness of the polishing pad to be finally produced. In such event, a reaction promoter may be used as the reaction rate controlling agent to form pores having a more uniform diameter.

Thereafter, the top and bottom ends of the molded body obtained from the mold can be cut out, respectively. For example, each of the top and bottom ends of the molded body may be cut out by ⅓ or less, 1/22 to 3/10, 1/20 to ⅓, 1/15 to 3/10, or 1/12 to ¼ of the total thickness of the molded body.

As a specific example, the molding is carried out using a mold having a height of 1.2 to 2 times the thickness of the porous polyurethane polishing pad to be finally produced, and a further step of cutting out each of the top and bottom ends of the molded body obtained from the mold upon the molding by 1/12 to ¼ of the total thickness of the molded body may then be carried out.

The above production process may further comprise the steps of machining grooves on the surface of the molded body after the cutting step, bonding with the lower part, inspection, packaging, and the like. These steps may be carried out in a conventional manner for preparing a polishing pad.

Porous Polyurethane Polishing Pad

The process for preparing a porous polyurethane polishing pad according to an embodiment is capable of controlling the polishing performance (or polishing rate) of the polishing pad by adjusting the size and distribution of pores in the polishing pad thus produced.

In detail, the polishing performance of the polishing pad according to the embodiment can be controlled by adjusting the thickness, specific gravity, surface hardness, tensile strength, elongation, AFM elastic modulus, and pore size and distribution of the polishing pad thus produced. Especially, since the AFM elastic modulus of a polishing surface, i.e., an area in direct contact with the object to be polished, of the polishing pad is appropriately adjusted, a wafer or the like can be efficiently polished. The porous polyurethane polishing pad can effectively polish a layer containing a metal. Further, the polishing pad can prevent scratches or the like that may be generated on a wafer or the like.

In more detail, the polishing pad has a thickness of 1.5 to 2.5 mm, a number of pores whose average diameter is 10 to 60 µm, a specific gravity of 0.7 to 0.9 g/cm$^3$, a surface hardness at 25° C. of 45 to 65 Shore D, a tensile strength of 15 to 25 N/mm$^2$, an elongation of 80 to 250%, an AFM (atomic force microscope) elastic modulus of 101 to 250 MPa measured from a polishing surface in direct contact with an object to be polished to a predetermined depth wherein the predetermined depth is 1 to 10 µm.

The porous polyurethane polishing pad has a thickness of 1.5 to 2.5 mm. Specifically, the porous polyurethane polishing pad may have a thickness of 1.8 to 2.5 mm. If the thickness of the polishing pad is within the above range, the basic physical properties as a polishing pad can be sufficiently exhibited.

As depicted in FIGS. 1 to 3, the polishing pad (100) comprises a number of pores (121, 122, and 130). Specifically, the polishing pad may comprise a number of pores such that it has a porosity of 45 to 50% by volume.

The average diameter of the pores may be 10 to 60 µm. In more detail, the average diameter of the pores may be 15 to 60 µm, 15 to 55 µm, or 15 to 50 µm. In more detail, the average diameter of the pores may be 15 to 45 µm, 15 to 40 µm, 15 to 38 µm, 15 to 35 µm, 15 to 30 µm, or 15 to 25 µm.

The pores may comprise closed pores (130) and open pores (121, 122). The closed pores are disposed inside the polishing pad, and most of the pores are closed pores.

The open pores are disposed on the upper surface or the lower surface of the polishing pad and are exposed to the outside. Specifically, the open pores may comprise a first open pore (121) and a second open pore (122) disposed on the upper surface of the polishing pad. More specifically, the first open pore and the second open pore may be adjacent to each other and spaced from each other.

The open pores (121, 122) may have an average diameter (D) of 10 to 30 µm and an average depth (H) of 8 to 28 µm.

A polishing surface (110) corresponds to the area between the first open pore and the second open pore. That is, the polishing surface may be a flat surface between the first open pore and the second open pore. In detail, the polishing surface may be the area of the upper surface other than the open pores. In more detail, the area of the polishing surface may be 30 to 70%, 30 to 60%, 40 to 60%, or 45 to 55% of the total area of the upper surface of the polishing pad.

The polishing surface is a surface that can be in direct contact with an object to be polished such as a wafer (200) or the like. That is, the polishing surface is in direct contact with the object to be polished such as a wafer and can directly participate in the polishing of the object to be polished.

The specific gravity of the polishing pad may be 0.7 to 0.9 g/cm$^3$. In detail, the specific gravity of the polishing pad may be 0.70 to 0.87 g/cm$^3$ or 0.75 to 0.87 g/cm$^3$. In more detail, the specific gravity of the polishing pad may be 0.75 to 0.87 g/cm$^3$, 0.77 to 0.85 g/cm$^3$, or 0.77 to 0.83 g/cm$^3$.

The surface hardness of the polishing pad may be 45 to 65 shore D at 25° C. In detail, the hardness of the polishing pad at 25° C. may be 45 to 62 shore D, 48 to 65 shore D, or 48 to 62 shore D. In more detail, the hardness of the polishing pad at 25° C. may be 48 to 60 shore D, 50 to 62 shore D, or 50 to 60 shore D.

The tensile strength of the polishing pad is 15 to 25 N/mm². In more detail, the tensile strength of the polishing pad may be 16 to 25 N/mm², 16 to 24 N/mm², or 16 to 23 N/mm².

The tensile elastic modulus of the polishing pad is 600 to 700 MPa. In more detail, the tensile elastic modulus of the polishing pad may be 600 to 690 MPa, 610 to 700 MPa, 610 to 690 MPa, 620 to 700 MPa, or 620 to 690 MPa.

The compressive elastic modulus of the polishing pad may be 60 to 90 kPa. In more detail, the compressive elastic modulus of the polishing pad may be 60 to 85 kPa, 60 to 80 kPa, 65 to 85 kPa, 60 to 80 kPa, or 70 to 85 kPa.

The Poisson's ratio of the polishing pad may be 0.35 to 0.40. In more detail, the Poisson's ratio of the polishing pad may be 0.36 to 0.39 or 0.36 to 0.38.

The elongation of the polishing pad may be 80 to 250%. In more detail, the elongation of the polishing pad may be 85 to 250%/0, 85 to 200%, 85 to 150%, 90 to 250%, 90 to 240%, or 92 to 230%. In more detail, the elongation of the polishing pad may be 95 to 230%, 95 to 200%, 100 to 200%/a, 100 to 150%/a, or 100 to 120%.

The AFM elastic modulus measured from a polishing surface to a predetermined depth may be 101 to 250 MPa. In more detail, the AFM elastic modulus measured from the polishing surface to the predetermined depth may be 101 to 240 MPa, 103 to 240 MPa, or 105 to 240 MPa. In more detail, the AFM elastic modulus measured from the polishing surface to the predetermined depth may be 110 to 240 MPa, 120 to 240 MPa, or 110 to 230 MPa. In more detail, the AFM elastic modulus measured from the polishing surface to the predetermined depth may be 120 to 230 MPa, 130 to 230 MPa, 130 to 200 MPa, or 130 to 180 MPa.

The predetermined depth is 1 to 10 µm. In more detail, the predetermined depth may be 1 to 8 µm, 3 to 10 µm, 3 to 8 µm, or 3 to 6 µm. In more detail, the predetermined depth may be 3 to 5 µm, 3.5 to 5 µm, or 3.5 to 4.5 µm. In more detail, the predetermined depth may be about 4 µm.

The AFM elastic modulus can be controlled by the NCO % of the urethane-based prepolymer, the kind of the curing agent, the average diameter and distribution of the pore, the porosity, the average diameter and the average depth of the open pores, the area ratio of the polishing surface, and the like. For example, in order for the AFM elastic modulus to fall within the above range, the content of unreacted NCO in the urethane-based prepolymer may be 9.0 to 10% by weight, the average diameter of the pores may be 10 to 30 µm, the area ratio of first pores with diameters smaller than the above average diameter by about 3 µm may be 10 to 20%, the area ratio of second pores with diameters larger than the above average diameter by about 3 µm may be 20 to 30%, the porosity may be 45 to 50% by volume, the average diameter of the open pores may be 10 to 30 µm, the average depth of the open pores may be 8 to 28 µm, and the ratio of the polishing surface in the upper surface may be 45 to 55%. That is, the AFM elastic modulus can be determined by the NCO content of the urethane-based prepolymer, the average pore diameter, the pore distribution, the porosity, the diameter and depth of the open pores, and the ratio of the polishing surface, but it is not limited thereto. The AFM elastic modulus can be controlled in various ways.

The polishing pad may comprise 0.5 to 10 parts by weight of the solid phase foaming agent based on 100 parts by weight of the urethane-based prepolymer. In such event, the average particle diameter of the solid phase foaming agent may be 10 to 50 µm.

The AFM hardness of the polishing surface may be 50 to 150 MPa. In detail, the AFM hardness of the polishing surface may be 50 to 145 MPa, 55 to 150 MPa, 55 to 145 MPa, 60 to 150 MPa, 60 to 145 MPa, 65 to 150 MPa, or 65 to 145 MPa.

The AFM square root mean roughness (RMS) of the polishing surface may be 30 to 110 nm. In detail, the AFM square root mean roughness of the polished surface may be 30 to 100 nm, 30 to 95 nm, 30 to 90 nm, 34 to 100 nm, 34 to 95 nm, 34 to 90 nm, or 30 to 85 nm.

The AFM elastic modulus is an elastic modulus measured by bringing a cantilever tip into contact with the polishing surface. The cantilever tip may be made of a harder material than the polishing pad. The cantilever tip may apply a force in the direction perpendicular to the polishing surface to measure the elasticity of the polishing surface.

In such event, the cantilever tip may apply a force to a predetermined depth of the polishing surface to measure the AFM elastic modulus. The predetermined depth may be 1 to 10 µm, 3 to 6 µm, or 3 to 5 µm.

Specifically, the cantilever tip may be made of a metal such as aluminum. The end of the cantilever tip may have a parabolic shape, and the radius of curvature of the end of the cantilever tip may be 10 nm or less. For example, a commercially available product that can be used as the cantilever tip is PPP-CONTSCR manufactured by NANOSENSORS.

The AFM hardness may be measured by the cantilever tip and an AFM instrument.

In more detail, the AFM elastic modulus and the AFM hardness may be calculated by the Oliver-Pharr Method.

The AFM square root mean roughness can be measured by an AFM instrument.

The porous polyurethane polishing pad is composed of a polyurethane resin, and the polyurethane resin may be derived from a urethane-based prepolymer having an isocyanate terminal group. In such event, the polyurethane resin comprises a monomer unit constituting the urethane-based prepolymer.

The polyurethane resin may have a weight average molecular weight of 500 to 3,000 g/mole. Specifically, the polyurethane resin may have a weight average molecular weight (Mw) of 600 to 2,000 g/mole or 700 to 1,500 g/mole.

The porous polyurethane polishing pad may have grooves on its surface for mechanical polishing. The grooves may have a depth, a width, and a spacing as desired for mechanical polishing, which are not particularly limited.

The porous polyurethane polishing pad according to the embodiments is capable of controlling the polishing performance (i.e., polishing rate) of the polishing pad by adjusting the thickness, specific gravity, surface hardness, tensile strength, elongation, AFM elastic modulus, and pore size and distribution of the polishing pad. In particular, since the AFM elastic modulus can be controlled by the NCO % of the urethane-based prepolymer, the kind of the curing agent, the average diameter and distribution of the pores, the porosity, the average diameter and the average depth of the open pores, the area ratio of the polishing surface, and the like, the porous polyurethane polishing pad according to the embodiments can effectively polish an object to be polished such as a wafer.

That is, the polishing performance of the polishing pad significantly hinges on the characteristics of a polishing surface, which is an area in direct contact with the object to be polished. Especially, since the polishing pad according to the embodiments has the characteristics as described above, it is possible to effectively polish a layer containing a metal. In addition, the polishing pad can prevent scratches or the like that may be generated on a wafer or the like.

Process for Preparing a Semiconductor Device

The process for preparing a semiconductor device according to an embodiment comprises providing a porous polyurethane polishing pad; disposing an object to be polished on the polishing pad; and relatively rotating the object to be polished with respect to the polishing pad to polish the object, wherein the polishing pad comprises a urethane-based prepolymer and a curing agent, and the polishing pad has a thickness of 1.5 to 2.5 mm, a number of pores whose average diameter is 10 to 60 μm, a specific gravity of 0.7 to 0.9 g/cm³, a surface hardness at 25° C. of 45 to 65 Shore D, a tensile strength of 15 to 25 N/mm², an elongation of 80 to 250%, an AFM elastic modulus of 101 to 250 MPa measured from a polishing surface in direct contact with the object to be polished to a predetermined depth wherein the predetermined depth is 1 to 10 μm.

The characteristics of the porous polyurethane polishing pad are as described above.

After the porous polyurethane polishing pad is mounted on a platen, a wafer (200) comprising a layer (210) that is to be polished and contains a metal such as tungsten is disposed on the polishing pad (100), as depicted in FIG. 3. In such event, the layer to be polished is in direct contact with the polishing surface of the polishing pad. Further, a polishing slurry is sprayed on the polishing pad. Then, the wafer and the polishing pad rotate relatively to each other, so that the layer to be polished is polished. In such event, the layer to be polished is in direct contact with the polishing surface of the polishing pad.

The object to be polished may comprise a metal layer. The metal layer is in direct contact with the polishing surface, so that the metal layer may be polished. In detail, the metal layer may comprise tungsten.

Hereinafter, the present invention is explained in detail by the following Examples. However, these examples are set forth to illustrate the present invention, and the scope of the present invention is not limited thereto.

EXAMPLE

Example 1: Preparation of a Porous Polyurethane Polishing Pad 1-1: Configuration of the Device In a casting machine equipped with feeding lines for a urethane-based prepolymer, a curing agent, an inert gas, and a reaction rate controlling agent, PUGL-600D (manufactured by SKC with a weight average molecular weight of 1,500 g/mole) having an unreacted NCO content of 9.1% by weight was charged in the prepolymer tank, and 4,4'-methylenebis(2-chloroaniline) (manufactured by TCI (Tokyo Chemical Industry)) was charged in the curing agent tank. Nitrogen ($N_2$) was prepared as an inert gas. In addition, triethylene diamine (TEDA; a reaction promoter) supplied by Sigma Aldrich Corporation was employed as a reaction rate controlling agent.

Furthermore, 2 part by weight of a solid phase foaming agent (manufactured by AkzoNobel under the brand name of Expancel 461 DET 20 d20 with an average particle diameter of 20 μm) and 0.5 part by weight of a silicone surfactant (manufactured by Evonik Industries under the brand name of B8462) were mixed in advance based on 100 parts by weight of the urethane-based prepolymer and then charged into the prepolymer tank.

1-2: Formation of a Sheet

The urethane-based prepolymer, the curing agent, the solid phase foaming agent, the reaction rate controlling agent, and the inert gas were stirred while they were fed to the mixing head at constant speeds through the respective feeding lines. The rotation speed of the mixing head was about 3,000 rpm. In such event, the molar equivalent ratio of the NCO group in the urethane-based prepolymer to the reactive groups in the curing agent was adjusted to 1:1, and the total feeding amount was maintained at a rate of 10 kg/min. In addition, the inert gas was fed in a volume of 15% based on the total volume of the urethane-based prepolymer, the curing agent, the solid phase foaming agent, the reaction promoter, and the silicone surfactant with a target specific gravity of a polyurethane sheet of 0.8 g/cm³. The reaction promoter was fed in an amount of 0.5 part by weight based on 100 parts by weight of the urethane-based prepolymer.

The mixed raw materials were injected into a mold (having a width of 1,000 mm, a length of 1,000 mm, and a height of 3 mm) and solidified to obtain a sheet. Thereafter, the surface of the sheet was ground using a grinder and then grooved using a tip, to thereby prepare a porous polyurethane polishing pad having an average thickness of 2 mm.

Examples 2 and 3

A porous polyurethane polishing pad having an average thickness of 2 mm was prepared in the same manner as in Example 1, except that the contents of the solid phase foaming agent, the surfactant, the inert gas, and the reaction promoter were adjusted as shown in Table 1.

Comparative Example 1

A porous polyurethane polishing pad was prepared in the same manner as in Example 1, except that a solid phase foaming agent having an average diameter of 40 μm was used and that a surfactant, an inert gas, and a reaction promoter were not used.

TABLE 1

|  | Content of solid phase foaming agent (diameter) | Content of surfactant | Content of inert gas | Content of reaction promoter |
|---|---|---|---|---|
| Ex. 1 | 2 part by weight (20 μm) | 0.5 part by weight | 15% by volume | 0.5 part by weight |
| Ex. 2 | 1.9 parts by weight (20 μm) | 0.5 part by weight | 16% by volume | 0.4 part by weight |
| Ex. 3 | 2.1 parts by weight (20 μm) | 0.5 part by weight | 13% by volume | 0.6 part by weight |

TABLE 1-continued

| | Content of solid phase foaming agent (diameter) | Content of surfactant | Content of inert gas | Content of reaction promoter |
|---|---|---|---|---|
| C. Ex. 1 | 10 parts by weight (40 μm) | — | — | — |

Test Example

The properties of the polishing pads prepared in the Examples and the Comparative Example were measured according to the following conditions and procedures. The results are shown in Tables 2 to 4.

(1) Surface Hardness

The Shore D hardness was measured. The polishing pad was cut into a size of 2 cm×2 cm (in a thickness of about 2 mm) and then allowed to stand for 16 hours under the conditions of a temperature of 25° C. and a humidity of 50±5%. Thereafter, the hardness of the polishing pad was measured using a hardness meter (D-type hardness meter).

(2) Specific Gravity

The polishing pad was cut into a rectangle of 4 cm×8.5 cm (in a thickness of 2 mm) and then allowed to stand for 16 hours under the conditions of a temperature of 23±2° C. and a humidity of 50±5%. The specific gravity of the polishing pad was measured using a gravimeter.

(3) Tensile Strength

The ultimate strength immediately before the fracture was measured while the polishing pad was tested at a rate of 50 mm/min using a universal testing machine (UTM).

(4) Elongation

The test was carried out in the same manner as the tensile strength measurement.

The maximum deformation amount immediately before the fracture was measured, and the ratio of the maximum deformation amount to the initial length was expressed in percent (%).

(5) Average Pore Diameter

The polishing pad was cut into a square of 2 cm×2 cm (in a thickness of 2 mm) and observed with a scanning electron microscope (SEM) at a magnification of 100 times. An image was obtained using an image analysis software, and the total pore diameter was measured from the image. Then, the average pore diameter was then calculated.

(6) AFM Elastic Modulus, AFM Hardness, and AFM Square Root Mean Roughness (RMS)

XE-150 manufactured by Park Systems was used as an AFM instrument, and PPM-CONTSCR manufactured by NANOSENSORS was installed as a cantilever in the AFM instrument. Further, a force was applied by the cantilever to a depth of 4 μm from the polishing surface of the polishing pad, and the AFM elastic modulus and the AFM hardness were measured using the cantilever. In addition, the AFM square root mean roughness was measured using the AFM instrument.

The polishing pad was cut into a rectangle of 2 cm×1.5 cm (in a thickness of 2 mm), and the AFM elastic modulus, the AFM hardness, and the AFM square root mean roughness were measured for 10 points randomly selected within a square of 1 cm 1 cm at the center of the upper surface of the sample. The values for the 10 points were averaged, and the results are shown in Table 3.

(7) Polishing Rate of Tungsten

A silicon wafer having a diameter of 300 mm with a tungsten film formed by a sputtering process was set on the porous polyurethane polishing pad mounted on the platen in a CMP polishing machine, while the tungsten film of the silicon wafer faced downward. Thereafter, the silicon oxide film was polished under a polishing load of 1.4 psi while the silicon wafer was rotated at a speed of 121 rpm, the platen was rotated at a speed of 115 rpm for 60 seconds, and a calcined silica slurry was supplied on the polishing pad at a rate of 190 ml/min. Upon completion of the polishing, the silicon wafer was detached from the carrier, mounted in a spin dryer, washed with purified water (DIW), and then dried with air for 15 seconds. The film thickness of the dried silicon wafer was measured before and after the polishing using a spectral reflectometer type thickness measuring instrument (Manufacturer: Kyence, Model: SI-F80R), and the polishing rate was calculated therefrom. The polishing rate was calculated using the following Equation 1.

Polishing rate=polished thickness of a silicon wafer (Å)/polishing time (minute) [Equation 1]

(8) Poisson's Ratio

The Poisson's ratio was measured using a strain gauge and a universal testing machine (UTM) under the conditions of a test speed of 1 mm/min, a grip distance of 115 mm, a load cell of 30 N, a temperature of 23±2° C., and a humidity of 45±5%.

(9) Tensile Elastic Modulus and Compressive Elastic Modulus

The tensile elastic modulus and compressive elastic modulus were measured using a jig for tensile experiments or a jig for compressive experiments and a universal testing machine (UTM) under the conditions of a test speed of 500 mm/min, a grip distance of 70 mm, a load cell of 1 kN, a temperature of 23±2° C., and a humidity of 45±5%.

TABLE 2

| | Average diameter of pores (μm) | Specific gravity (g/cm³) | Surface hardness (25° C.) (Shore D) | Elongation (%) | Tensile strength (N/mm²) |
|---|---|---|---|---|---|
| Ex. 1 | 20 | 0.8 | 58 | 110 | 21 |
| Ex. 2 | 20 | 0.8 | 58 | 105 | 20 |
| Ex. 3 | 20 | 0.8 | 58 | 101 | 19 |
| C. Ex. 1 | 40 | 0.8 | 58 | 103 | 20 |

TABLE 3

| | AFM elastic modulus (MPa) | AFM hardness (MPa) | AFM RMS (nm) |
|---|---|---|---|
| Ex. 1 | 171 | 143 | 80 |
| Ex. 2 | 136 | 70 | 44 |
| Ex. 3 | 164 | 129 | 35 |
| C. Ex. 1 | 83 | 41 | 52 |

TABLE 4

|  | Tensile elastic modulus (MPa) | Compressive elastic modulus (kPa) | Poisson's ratio | Polishing rate of oxide (Å/min) |
| --- | --- | --- | --- | --- |
| Ex. 1 | 645 | 77 | 0.375 | 1,120 |
| Ex. 2 | 652 | 79 | 0.369 | 1,230 |
| Ex. 3 | 661 | 80 | 0.371 | 1,300 |
| C. Ex. 1 | 439 | 48 | 0.373 | 950 |

As shown in Tables 2 to 4, the polishing pads of Examples 1 to 3 had higher AFM elastic modulus values and higher polishing rates of tungsten than those of the polishing pad of Comparative Example 1.

The invention claimed is:

1. A porous polyurethane polishing pad, which comprises a urethane-based prepolymer;
a solid phase foaming agent in an amount of 0.5 to 10 parts by weight based on 100 parts by weight of the urethane-based prepolymer; and
a curing agent,
wherein the porous polyurethane polishing pad has a thickness of 1.5 to 2.5 mm, a number of pores whose average diameter is 10 to 60 μm, a specific gravity of 0.7 to 0.9 g/cm$^3$, a surface hardness at 25° C. of 45 to 65 Shore D, a tensile strength of 15 to 25 N/mm$^2$, an elongation of 80 to 250%, an AFM (atomic force microscope) elastic modulus of 101 to 250 MPa measured from a polishing surface in direct contact with an object to be polished to a predetermined depth wherein the predetermined depth is 1 to 10 μm.

2. The porous polyurethane polishing pad of claim 1, wherein the solid phase foaming agent has an average particle diameter of 10 to 60 μm.

3. The porous polyurethane polishing pad of claim 1, which has an AFM hardness of the polishing surface of 50 to 150 MPa.

4. The porous polyurethane polishing pad of claim 1, which has an AFM square root mean roughness of the polishing surface of 30 to 110 nm.

5. The porous polyurethane polishing pad of claim 1, wherein the polishing pad comprise a number of open pores exposed to the outside, the open pores comprise a first open pore and a second open pore that are adjacent to each other and spaced from each other, and the polishing surface is disposed between the first open pore and the second open pore.

6. The porous polyurethane polishing pad of claim 5, wherein the area of the polishing surface is 30 to 70% of the total area of the upper surface of the polishing pad.

7. The porous polyurethane polishing pad of claim 5, wherein the open pores have an average diameter of 10 to 30 μm and an average depth of 8 to 28 μm.

8. A process for preparing a semiconductor device, which comprises providing a porous polyurethane polishing pad; disposing an object to be polished on the polishing pad; and relatively rotating the object to be polished with respect to the polishing pad to polish the object,
wherein the polishing pad comprises a urethane-based prepolymer, a solid phase foaming agent in an amount of 0.5 to 10 parts by weight based on 100 parts by weight of the urethane-based prepolymer, and a curing agent; and
wherein the polishing pad has a thickness of 1.5 to 2.5 mm, a number of pores whose average diameter is 10 to 60 μm, a specific gravity of 0.7 to 0.9 g/cm$^3$, a surface hardness at 25° C. of 45 to 65 Shore D, a tensile strength of 15 to 25 N/mm$^2$, an elongation of 80 to 250%, an AFM (atomic force microscope) elastic modulus of 101 to 250 MPa measured from a polishing surface in direct contact with the object to be polished to a predetermined depth wherein the predetermined depth is 1 to 10 μm.

9. The process for preparing a semiconductor device of claim 8, wherein the object to be polished comprises a metal layer, and the metal layer is in direct contact with the polishing surface, so that the metal layer is polished.

10. The process for preparing a semiconductor device of claim 9, the metal layer comprises tungsten.

* * * * *